(12) United States Patent
Besling et al.

(10) Patent No.: US 11,366,031 B2
(45) Date of Patent: Jun. 21, 2022

(54) SEMICONDUCTOR DEVICE AND METHOD FOR FORMING A SEMICONDUCTOR DEVICE

(71) Applicant: Sciosense B.V., AE Eindhoven (NL)

(72) Inventors: Willem Frederik Adrianus Besling, JN Eindhoven (NL); Casper Van Der Avoort, TG Waalre (NL); Coenraad Cornelis Tak, JS Waalre (NL); Remco Henricus Wilhelmus Pijnenburg, AE Hoogeloon (NL); Olaf Wunnicke, PR Eindhoven (NL); Martijn Goossens, AT Veldhoven (NL)

(73) Assignee: SCIOSENSE B.V., AE Eindhoven (NL)

( * ) Notice: Subject to any disclaimer, the term of this patent is extended or adjusted under 35 U.S.C. 154(b) by 388 days.

(21) Appl. No.: 16/337,554

(22) PCT Filed: Oct. 2, 2017

(86) PCT No.: PCT/EP2017/074962
§ 371 (c)(1),
(2) Date: Mar. 28, 2019

(87) PCT Pub. No.: WO2018/060518
PCT Pub. Date: Apr. 5, 2018

(65) Prior Publication Data
US 2019/0234821 A1   Aug. 1, 2019

(30) Foreign Application Priority Data

Sep. 30, 2016   (EP) .................................... 16191885

(51) Int. Cl.
*G01L 9/00* (2006.01)
*B81B 7/00* (2006.01)
(Continued)

(52) U.S. Cl.
CPC .......... *G01L 9/0072* (2013.01); *B81B 3/0021* (2013.01); *B81B 7/0061* (2013.01);
(Continued)

(58) Field of Classification Search
CPC ..... G01L 9/0072; G01L 1/148; B81B 7/0091; B81B 3/0021; B81B 2203/0127
See application file for complete search history.

(56) References Cited

U.S. PATENT DOCUMENTS

| 7,573,138 B2 | 8/2009 | Lee et al. |
| 8,129,801 B2 | 3/2012 | Eskridge |

(Continued)

FOREIGN PATENT DOCUMENTS

| WO | 2012/037536 | 3/2012 |
| WO | 2015/106855 | 7/2015 |

(Continued)

OTHER PUBLICATIONS

European Patent Office, International Search Report for PCT/EP2017/074962 dated Nov. 7, 2017.

*Primary Examiner* — Nathaniel J Kolb
(74) *Attorney, Agent, or Firm* — Slater Matsil, LLP

(57) ABSTRACT

In an embodiment, a semiconductor device includes a substrate body, an environmental sensor, a cap body and a volume of gas, wherein the environmental sensor and the volume of gas are arranged between the substrate body and the cap body in a vertical direction which is perpendicular to a main plane of extension of the substrate body, wherein at least one channel between the substrate body and the cap body connects the volume of gas with an environment of the semiconductor device such that the channel is permeable for gases, and wherein a thickness of the substrate body amounts to at least 80% of a thickness of the cap body and at most 120% of the thickness of the cap body.

16 Claims, 9 Drawing Sheets

(51) Int. Cl.
*B81B 3/00* (2006.01)
*G01L 1/14* (2006.01)

(52) U.S. Cl.
CPC ...... *G01L 1/148* (2013.01); *B81B 2201/0264* (2013.01); *B81B 2203/0127* (2013.01)

(56) References Cited

U.S. PATENT DOCUMENTS

| | | |
|---|---|---|
| 9,105,479 B2 | 8/2015 | Besling et al. |
| 9,297,713 B2 | 3/2016 | Lo et al. |
| 2005/0155411 A1 | 7/2005 | Rogalla et al. |
| 2005/0217370 A1* | 10/2005 | Takahashi .......... G01N 33/0009 73/431 |
| 2013/0168840 A1 | 7/2013 | Merassi et al. |
| 2014/0053651 A1 | 2/2014 | Besling et al. |
| 2014/0070337 A1* | 3/2014 | Besling ................... H01L 21/77 438/51 |
| 2019/0250135 A1* | 8/2019 | Andersson ............. B01D 71/36 |

FOREIGN PATENT DOCUMENTS

| | | |
|---|---|---|
| WO | 2015/124432 | 8/2015 |
| WO | 2018/060515 | 4/2018 |

\* cited by examiner

SEMICONDUCTOR DEVICE AND METHOD FOR FORMING A SEMICONDUCTOR DEVICE

The present application relates to a semiconductor device and a method for forming a semiconductor device.

BACKGROUND OF THE INVENTION

Semiconductor devices can comprise environmental sensors as, for example, pressure sensors. Several environmental sensors and especially pressure sensors are sensitive to stress. Stress can be induced on an environmental sensor, if the coefficients of thermal expansion of the substrate and other parts of the semiconductor device are different and the device is cooled or heated during processing. It is also possible that stress is induced by external forces such as, for example, during soldering the device onto a printed circuit board, bending or other deformation of the printed circuit board or forces applied to the device during the calibration. In order to keep the same conditions as during calibration of the device it is desired that no additional stress is induced on the device after the calibration. It is furthermore desired to reduce the package height of semiconductor devices comprising an environmental sensor in order to include the semiconductor device in mobile phones or other portable devices.

Additional stress induced on a semiconductor device can be avoided, for example by the use of thick glue layers or thick ceramic substrates. However, in both cases the thickness and also the footprint of the semiconductor device are increased, which is not desirable for applications in mobile phones or other portable devices.

SUMMARY OF THE INVENTION

The present disclosure provides a semiconductor device with an environmental sensor with a small package height of the semiconductor device. It further improves the accuracy of the environmental sensor of the semiconductor device.

Furthermore, the present disclosure provides a method for forming a semiconductor device with an environmental sensor with a small package height of the semiconductor device and an improved accuracy of the environmental sensor.

In one embodiment of the semiconductor device the semiconductor device comprises a substrate body. The substrate body can be a wafer, a substrate or a bulk material and it can comprise silicon or glass. The substrate body can comprise an integrated circuit and a substrate.

The semiconductor device comprises an environmental sensor. The environmental sensor can be, for example, a capacitive pressure sensor with a membrane. The environmental sensor is arranged on top of the substrate body, for example on top of the integrated circuit.

The semiconductor device comprises a cap body. The cap body can comprise silicon, glass or a semiconductor. It is also possible that the cap body comprises glass with a coefficient of thermal expansion which is similar to the coefficient of thermal expansion of the substrate body. The cap body and the substrate body can be of the same material or they can comprise different materials. The cap body can be a wafer, a substrate or a bulk material which is arranged on top of the environmental sensor.

The semiconductor device comprises a volume of gas. The environmental sensor and the volume of gas are arranged between the substrate body and the cap body in a vertical direction which is perpendicular to the main plane of extension of the substrate body. The volume of gas can be arranged above the environmental sensor in vertical direction and around the environmental sensor.

The semiconductor device comprises at least one channel between the substrate body and the cap body where the channel connects the volume of gas with the environment of the semiconductor device such that the channel is permeable for gases. "Permeable for gases" in this case means that gases from the environment of the semiconductor device can reach the volume of gas within the semiconductor device and the other way around. The channel can be arranged next to the environmental sensor in a lateral direction. The channel can have a diameter which is small in comparison to the lateral extension of the semiconductor device and it can also be a channel with a lateral extension which is similar to the lateral extension of the semiconductor device.

The substrate body and the cap body can be connected with each other via a bonding material. The bonding material is arranged between the substrate body and the cap body. The cap body and the substrate body can be connected with each other by, for example, gluing, fusion bonding or eutectic bonding. By connecting the cap body and the substrate body an airtight connection is formed, except for the channel. The bonding material can be applied on the substrate body as a foil or via spin coating in the case of glue. In another embodiment the bonding material is applied by Physical Vapor Deposition (PVD), Chemical Vapor Deposition (CVD), Plasma Enhanced Chemical Vapor Deposition (PECVD) and or Atomic Layer Deposition (ALD). The channel can be formed in the bonding material, therefore the bonding material can be patterned by lithographic etching. The semiconductor device can comprise several channels within the bonding material.

Since the cap body is arranged on top of the substrate body and the environmental sensor the thickness of the semiconductor device is increased and also the stiffness of the semiconductor device is increased. Therefore, additional stress on the environmental sensor or other integrated circuits in the semiconductor device is reduced. Furthermore, the environmental sensor is protected by the cap body during processing. Moreover, the substrate body can be thin enough to introduce an electrically conductive via or other electrical contacts in the substrate body since the cap body increases the total thickness of the semiconductor device.

Advantageously, the cap body is not patterned, which means that it comprises no electrical contacts or electrically conductive vias. Therefore, the handling of the semiconductor device is improved and the semiconductor device can be vacuum-picked at the top side of the cap body facing away from the substrate body. Additionally, the cap body can be grinded without the risk of damaging the environmental sensor.

If the cap body comprises a transparent material it is also possible to incorporate optical sensors into the semiconductor device and a visual inspection of the environmental sensor and alignment of the sensors are possible.

Moreover, by forming a stiff package without the use of glue layers or thick substrates, the footprint of the device can be reduced. Additional stress on the environmental sensor can be effectively reduced by positioning the environmental sensor in a plane of minimal stress within the semiconductor device. As described below this means that the stiffness of the substrate body and the cap body are approximately equal. If the cap body and the substrate body are constructed out of similar materials this means that the thicknesses and or the masses are approximately equal.

In one embodiment the semiconductor device comprises a substrate body, an environmental sensor, a cap body and a volume of gas. The environmental sensor and the volume of gas are arranged between the substrate body and the cap body in a vertical direction which is perpendicular to the main plane of extension of the substrate body, and at least one channel between the substrate body and the cap body connects the volume of gas with the environment of the semiconductor device such that the channel is permeable for gases.

In one embodiment of the semiconductor device the environmental sensor comprises at least one of the following:
  a capacitive pressure sensor with a membrane,
  a temperature sensor,
  an optical sensor,
  an absolute pressure sensor,
  a Hall sensor,
  a gas sensor,
  a humidity sensor,
  a gas flow sensor,
  a differential pressure sensor.

It is also possible to arrange several environmental sensors next to each other, for example for the detection of pressure, fluids, gases or light.

The capacitive pressure sensor can comprise a cavity below the membrane. The advantages of capacitive pressure sensing are a low power consumption, a high sensitivity and a high resolution. Furthermore, it can be integrated directly on top of an integrated circuit. With this, the footprint of the device can be reduced.

In one embodiment of the semiconductor device the environmental sensor is arranged on an integrated circuit. The environmental sensor can be arranged on top of the final passivation layer of a complementary metal oxide semiconductor device readout circuit. With this arrangement the total lateral size of the semiconductor device can be reduced. Moreover, the additional stress is also minimized for the integrated circuit and not only for the environmental sensor since it is protected by the substrate body and the cap body.

In one embodiment the semiconductor device is airtight except for the channel. This means that the semiconductor device comprises no other openings or channels than the at least one channel between the substrate body and the cap body which connects the volume of gas with the environment of the semiconductor device. In this case "airtight" means that only the at least one channel is permeable for gases from the environment of the semiconductor device to the volume of gas and the other way around. With this arrangement a pressure sensor in the semiconductor device can sense the pressure of the gas surrounding the semiconductor device. By introducing the channel between the substrate body and the cap body the opening of the channel towards the environment of the semiconductor device is positioned at a side surface of the semiconductor device. This arrangement is advantageous for the processing of the semiconductor device since it can be vacuum-picked at the cap body and the substrate body can be processed from a bottom side of the semiconductor device.

In one embodiment of the semiconductor device the volume of gas is arranged above the environmental sensor, the channel is arranged next to the environmental sensor and the channel extends in a lateral direction which is perpendicular to the vertical direction. The volume of gas can also be arranged around the environmental sensor. If the environmental sensor comprises a pressure sensor, it can measure the pressure in the volume of gas which is similar or the same as the pressure in the environment of the semiconductor device. If a bonding material is arranged between the substrate body and the cap body the channel can laterally extend through the bonding material.

In one embodiment of the semiconductor device a wall is arranged in the at least one channel where the thickness of the wall amounts to less than 10 μm. The wall can comprise a polymer material with a sufficiently large pore size such that gases from the environment of the semiconductor device can diffuse through the wall towards the volume of gas within the semiconductor device and the other way around. This means that liquids or solids as dirt particles cannot pass through the channel towards the volume of gas within the semiconductor device but the wall is permeable for gases. Therefore, the volume of gas is protected from dirt which can, for example, occur during rinsing, grinding or dicing of the semiconductor device. If a bonding material is arranged between the substrate body and the cap body the wall can comprise the same material as the bonding material.

In one embodiment of the semiconductor device the thickness of the substrate body equals approximately the thickness of the cap body. "Approximately" in this case means that the thickness of the substrate body can amount to at least 80% of the thickness of the cap body and at most 120% of the thickness of the cap body. Optionally, the thickness of the substrate body amounts to at least 90% of the thickness of the cap body and at most 110% of the thickness of the cap body. This means, that the thicknesses of the substrate body and the cap body are approximately equal within a tolerance of manufacturing.

In order to form a substrate body and a cap body with equal stiffness, the thicknesses of the cap body and the substrate body can be chosen to be equal if they comprise the same material. If the cap body and the substrate body comprise different materials the thicknesses for the case of equal stiffness can be determined by taking into account the Young modulus and the density of the different materials. If the stiffness of the cap body and the substrate body are approximately equal the environmental sensor is positioned in the plane of minimal stress. This means it is protected against strain which can be caused, for example, by different coefficients of thermal expansion of the device and a printed circuit board. The environmental sensor can also be protected against additional stress induced from other parts of the semiconductor device or the surroundings of the semiconductor device. If the environmental sensor comprises a capacitive pressure sensor with a membrane and a cavity, the accuracy of the pressure reading can be improved since no additional stress is induced on the membrane. Additionally, the capacitive pressure sensor can operate under the same conditions as during the calibration of the capacitive pressure sensor, thus guaranteeing a correct and more accurate pressure reading.

In one embodiment of the semiconductor device the coefficients of thermal expansion of the cap body and the substrate body are approximately the same. With this, additional stress induced during cooling or heating during the processing can be reduced.

In one embodiment of the semiconductor device the channel comprises at least one bend. This means, that the channel is not a straight line but comprises, for example, one or more bends or corners. With this, dust and other particles can be kept out of the volume of gas. This means that there is no direct line of sight from the side of the semiconductor device through the channel to the environmental sensor. If the environmental sensor comprises a capacitive pressure sensor it is necessary to keep particles which would disturb the pressure measurement out of the volume of gas.

In one embodiment the semiconductor device comprises at least one further channel and all channels are arranged symmetrically around the environmental sensor. With a symmetrical distribution of the channels around the environmental sensor the stress within the bonding material is symmetrically distributed and non-uniform stress on the environmental sensor is reduced.

In one embodiment of the semiconductor device the cap body comprises a first part which is transparent for electromagnetic radiation and/or a second part which is opaque. If a first part of the cap body is transparent for electromagnetic radiation an optical sensor can be arranged between the substrate body and the cap body. If a second part of the cap body is opaque one or more sensors which require isolation from electromagnetic radiation can be arranged between the cap body and the substrate body.

In one embodiment of the semiconductor device the cap body is patterned and/or comprises at least one electrically conductive via. It is possible to apply a metal layer as an electromagnetic interference shield layer on top of the cap body or below the cap body. Therefore, a connection to ground might be required and the cap body can be patterned such that an electrical connection or an electrically conductive via towards the substrate body is formed through the cap body. It is also possible to form electrical contacts on top of the cap body and electrically connect these contacts with the substrate body.

In one embodiment of the semiconductor device the substrate body comprises at least one vertical, electrically conductive via and/or wherein the semiconductor device is surface-mountable. Vertical in this case means along the vertical direction which means that the electrically conductive via extends from the bottom side of the substrate body which faces away from the environmental sensor in the direction of the environmental sensor. The electrically conductive via electrically contacts the environmental sensor or another electrical contact, for example a back contact of an integrated circuit. The electrically conductive via can be a through silicon via which is formed by patterning of the substrate body, for example by etching. A trench patterned in the substrate body can be coated with an isolation material and with an electrically conductive material to contact the environmental sensor.

In order to form the electrically conductive via in the substrate body, the substrate body can be thinned to, for example, 100 to 200 µm. Since the cap body is arranged on top of the pressure sensor, it is possible to thin the substrate body so that the electrically conductive via can be formed. With this, the semiconductor device can be surface mountable. Surface mountable means that the semiconductor device can be electrically contacted from the bottom side of the substrate body. The electrically conductive via can be electrically contacted on the bottom side of the substrate body by a solder ball.

In one embodiment of the semiconductor device the substrate body and the cap body are connected via a bonding material which comprises at least one of the following: a polymer, a photo-definable glue, a non-photosensitive glue, a metal, an oxide, a nitride. The bonding material can be applied to the substrate body by spin-coating or as a foil. The at least one channel can be formed within the bonding material by lithographic etching. If the bonding material comprises a metal it can be connected with the cap body by eutectic bonding. A eutectic bond is a very stable bond and it is also stable at high temperatures. Therefore, in the case of eutectic bonding other processing steps, such as for example the formation of an electrically conductive via with tungsten in the substrate body, are possible.

Furthermore, a method for forming a semiconductor device is provided. The semiconductor device may be produced by means of one of the methods described herein. This means that all features disclosed for the semiconductor device are also disclosed for the method for forming the semiconductor device and vice versa.

According to at least one embodiment of the method for forming a semiconductor device, the method comprises providing an environmental sensor on a substrate body, applying a bonding material on top of the substrate body, forming at least one channel in the bonding material which extends through the bonding material towards the environmental sensor, and connecting a cap body via the bonding material to the substrate body.

The cap body and the substrate body can be connected with each other by gluing, fusion bonding or eutectic bonding. By connecting the cap body and the substrate body an airtight connection is formed, except for the channel. The bonding material can be applied on the substrate body as a foil or via spin coating. The channel can be formed in the bonding material, for example by patterning the bonding material by lithographic etching. The semiconductor device can comprise several channels within the bonding material.

Since the cap body is arranged on top of the substrate body and the environmental sensor the thickness of the semiconductor device is increased and also the stiffness of the semiconductor device is increased. Therefore, additional stress on the environmental sensor or other integrated circuits in the semiconductor device is reduced. Furthermore, the environmental sensor is protected by the cap body during processing. Moreover, the substrate body can be thin enough to introduce an electrically conductive via or other electrical contacts in the substrate body since the cap body increases the total thickness of the semiconductor device.

Advantageously, the cap body is not patterned, which means that it comprises no electrical contacts or electrically conductive vias. Therefore, the handling of the semiconductor device is improved and the semiconductor device can be vacuum-picked at the top side of the cap body facing away from the substrate body. Additionally, the cap body can be grinded without the risk of damaging the environmental sensor.

If the cap body comprises a transparent material it is also possible to incorporate optical sensors into the semiconductor device and a visual inspection of the environmental sensor and alignment of the sensors are possible.

Moreover, by forming a stiff package without the use of glue layers or thick substrates, the footprint of the device can be reduced. Additional stress on the environmental sensor can be effectively reduced by positioning the environmental sensor in a plane of minimal stress within the semiconductor device.

According to at least one embodiment of the method for forming a semiconductor device a vertical, electrically conductive via is formed in the substrate body after the cap body is connected with the bonding material. If the environmental sensor comprises a capacitive pressure sensor with a membrane, the membrane is released before further processing and it is protected by the cap body against damage during processing.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

With FIGS. 9A to 9K, exemplary embodiments of the method for forming a semiconductor device are described.

DETAILED DESCRIPTION

Figure 1:
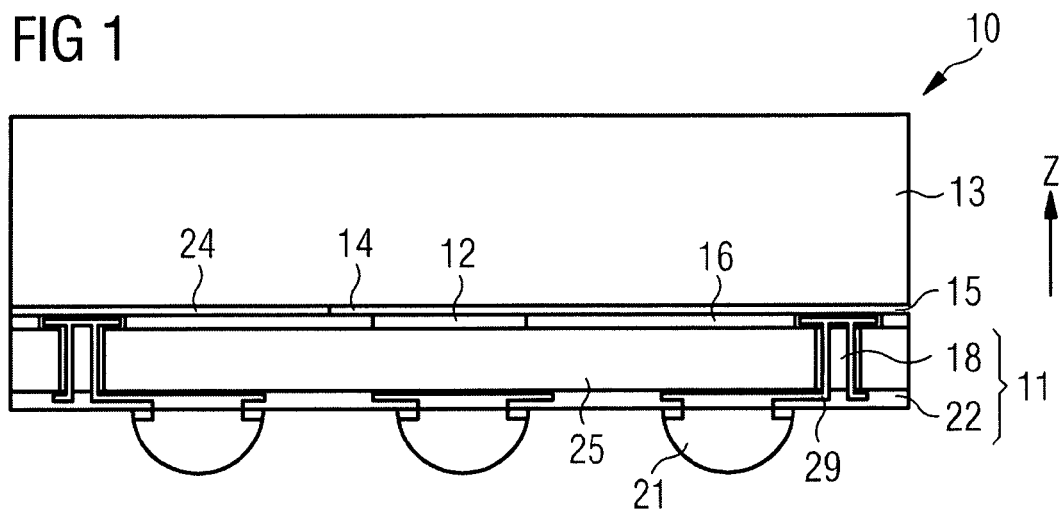
FIG. 1 shows a cutaway view of an exemplary embodiment of the semiconductor device.

FIG. 1 shows a cutaway view of an exemplary embodiment of the semiconductor device 10. A substrate body 11 comprises a substrate 25 and an integrated circuit 16 which can be a complementary metal oxide semiconductor device. On top of the substrate body 11, in vertical direction z, an environmental sensor 12 is arranged. The environmental sensor 12 and the integrated circuit 16 are electrically contacted by electrically conductive vias 18. The electrically conductive vias 18 extend through the substrate body 11 from a bottom side 26 of the substrate body 11 towards the top in vertical direction z. The electrically conductive vias 18 are electrically connected to solder balls 21 at the bottom side 26 and they are electrically isolated from the substrate 25 by an isolation layer 22. A cap body 13 is arranged on top of the substrate body 11 and the environmental sensor 12. The substrate body 11 and the cap body 13 are connected via a bonding material 24. Between the environmental sensor 12 and the cap body 13, a volume of gas 14 is arranged. Between the substrate body 11 and the cap body 13, a channel 15 connects the volume of gas 14 with the environment of the semiconductor device 10 such that the channel 15 is permeable for gases. If the environmental sensor 12 comprises a capacitive pressure sensor 23, gas from the environment of the semiconductor device 10 can reach the volume of gas 14 within the semiconductor device 10 such that the capacitive pressure sensor 23 can determine the pressure of the environment of the semiconductor device 10.

Figure 2A:
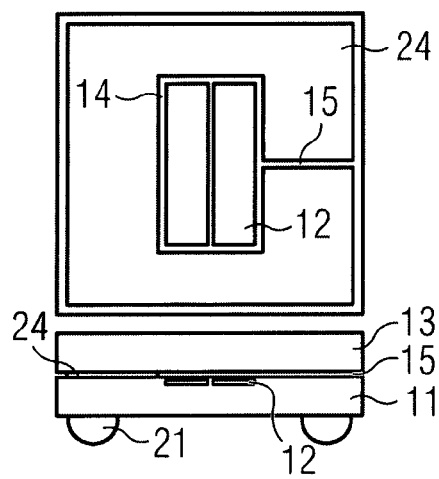
FIGS. 2A and 2B show a top view and a cutaway view of an exemplary embodiment of the semiconductor device.

FIG. 2A shows a top view and a cutaway view of an exemplary embodiment of the semiconductor device 10. In the top view, the semiconductor device 10 is shown without the cap body 13. In the center of the semiconductor device 10, two environmental sensors 12 are arranged next to each other. Between and around the two environmental sensors 12, there is a volume of gas 14. On top of the substrate body 11 and around the two environmental sensors 12, the bonding material 24 is arranged. In this embodiment, the channel 15 is arranged within the bonding material 24. This means the bonding material 24 is patterned in such a way that the channel 15 is formed, for example, by lithographic etching. The channel 15 connects the volume of gas 14 with the environment of the semiconductor device 10. The cutaway view shows the semiconductor device 10 with the cap body 13 and the substrate body 11. At the bottom side 26 of the substrate body 11, two solder balls 21 are arranged as electrical contacts. The two environmental sensors 12 are arranged in the center of the semiconductor device 10. The bonding material 24 is only shown on the left side in the cutaway view in order to indicate that on the right side, the channel 15 is formed in the bonding material 24.

Figure 2B:
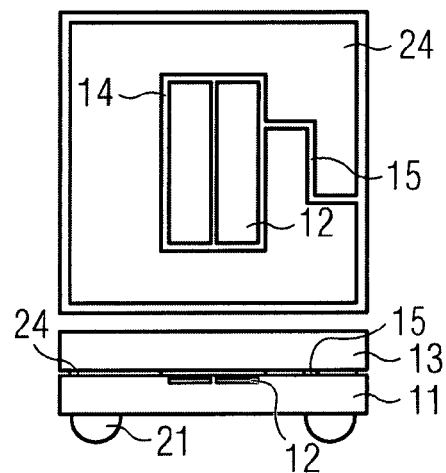

In FIG. 2B, a top view and a cutaway view of an exemplary embodiment of the semiconductor device 10 are shown. The setup of the semiconductor device 10 is similar to the embodiment shown in FIG. 2A except for the shape of the channel 15 in the bonding material 24. In this embodiment, the channel 15 is not a straight line but involves two corners. With this, dirt or other particles can be kept out of the volume of gas 14.

Figure 3A:
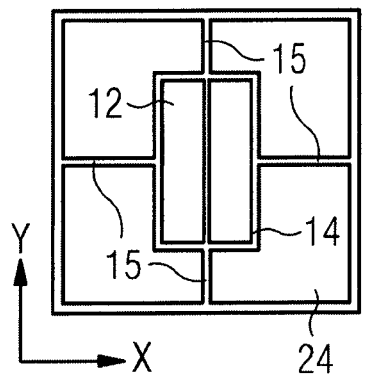
FIGS. 3A to 3C and FIGS. 4A to 4C show top views of exemplary embodiments of the semiconductor device.

In FIG. 3A, a top view of an embodiment of the semiconductor device 10 is shown. In the center of the semiconductor device 10, two rectangular shaped environmental sensors 12 are arranged. The cap body 13 is not shown. The bonding material 24 is arranged around the two environmental sensors 12 and four channels 15 are arranged within the bonding material 24. In this embodiment, the four channels 15 are symmetrically distributed around the two environmental sensors 12. The four channels 15 each extend from one of the centers of the sides of the semiconductor device 10 towards the environmental sensors 12 in the center of the semiconductor device 10. Since the environmental sensors 12 are rectangular shaped and the bonding material 24 is arranged closely around the environmental sensors 12, the distribution of the bonding material 24 around the environmental sensors 12 is not symmetrical. This means, on an x-axis a larger amount of bonding material 24 is arranged around the environmental sensors 12 than on a y-axis. An asymmetrical distribution of the bonding material 24 can lead to an asymmetrical distribution of the stress within the semiconductor device 10.

Figure 3B:
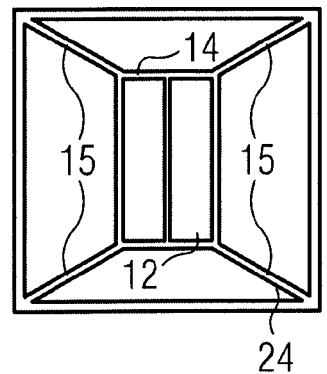

In FIG. 3B, a top view of an exemplary embodiment of a semiconductor device 10 is shown. The setup of the semiconductor device 10 is similar to the one shown in FIG. 3A, except for the position of the channels 15. In this case, the four channels 15 extend from the corners of the semiconductor device 10 towards the corners of the volume of gas 14. As in FIG. 3A, the channels 15 have the shape of a straight line.

Figure 3C:
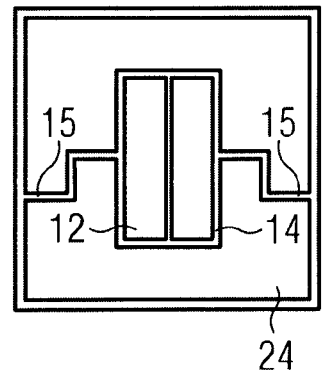

In FIG. 3C, a top view of an exemplary embodiment of the semiconductor device 10 is shown. The setup of the semiconductor device 10 is similar to the setups shown in FIGS. 3A and 3B, except for the arrangement of the channels 15 within the bonding material 24. In this case, only two channels 15 extend from two different sides of the semiconductor device 10 towards the volume of gas 14. Both channels 15 comprise two corners in order to keep dirt out of the volume of gas 14.

Figure 4A:
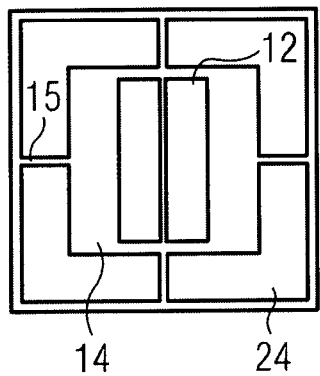

In FIG. 4A, a top view of an exemplary embodiment of the semiconductor device 10 is shown. As described for FIG. 3A, two environmental sensors 12, which are rectangular shaped, are arranged in the center of the semiconductor device 10. In this case, the volume of gas 14 around the environmental sensors 12 is larger than in the embodiment shown in FIG. 3A. Because of the larger size of the volume of gas 14, the bonding material 24 is symmetrically distributed around the two environmental sensors 12. Therefore, also the stress distribution within the semiconductor device 10 is more symmetrical. Four channels 15 are also symmetrically arranged around the environmental sensors 12 and they extend each from one of the sides of the semiconductor device 10 towards the volume of gas 14.

Figure 4B:
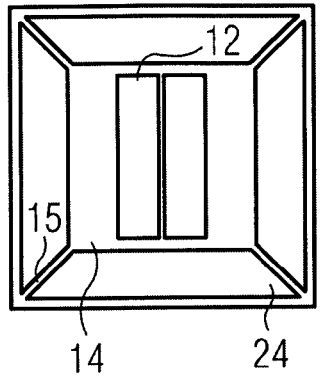

In FIG. 4B, a top view of another exemplary embodiment of the semiconductor device 10 is shown. The setup of the semiconductor device 10 is similar to the setup shown in FIG. 4A. The only difference to the setup shown in FIG. 4A is that the four channels 15 extend from the corners of the semiconductor device 10 towards the volume of gas 14.

Figure 4C:
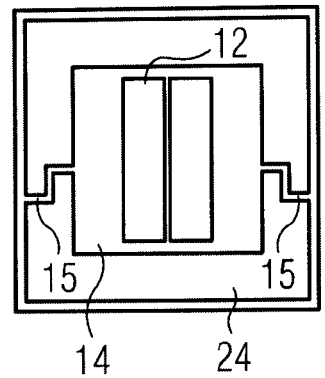

FIG. 4C shows a top view of an exemplary embodiment of the semiconductor device 10. The setup is similar to the setups shown in FIGS. 4A and 4B, except for the shape of the channels 15. In this case, only two channels 15 are arranged within the bonding material 24 and both channels 15 extend from one of the sides of the semiconductor device 10 towards the volume of gas 14. Furthermore, both channels 15 comprise two bends.

Figure 5A:
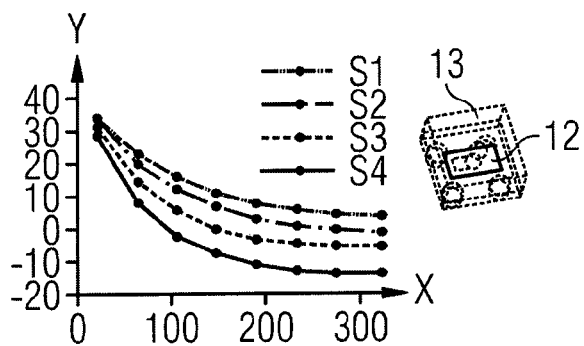
In FIGS. 5A and 5B, the stress tensor is plotted against the cap thickness for two exemplary embodiments of the semiconductor device.

In FIG. 5A, COMSOL simulations of the stress tensor in the plane of the environmental sensor 12 are shown. On the y-axis the stress tensor is plotted over the thickness of the cap body 13 on the x-axis for two different embodiments of the semiconductor device 10. The stress tensor is given in Mega Newton per square meter and the thickness of the cap body 13 is given in μm. In both embodiments of the semiconductor device 10, the environmental sensor 12 is rectangular shaped and it is arranged in the center of the semiconductor device 10. Therefore, the bonding material 24 is asymmetrically distributed around the environmental sensor 12. This results in different stress tensors in the x- and the y-direction. Curve S1 shows the stress tensor in y-direction and curve S2 in x-direction for a semiconductor device 10 with an integrated circuit 16 with a thickness of 150 μm. Similarly, curve S3 shows the stress tensor in y-direction and curve S4 in x-direction for a semiconductor device 10 with an integrated circuit 16 with a thickness of 100 μm. This means, the position of the plane of minimal stress is influenced by an asymmetric distribution of the bonding material 24. Therefore, it is desirable to choose the thickness of the cap body 13 such that the stress tensor is minimal in the plane of the environmental sensor 12.

The inset in FIG. 5A shows a three-dimensional view of the semiconductor device 10 with a rectangular shaped environmental sensor 12.

Figure 5B:
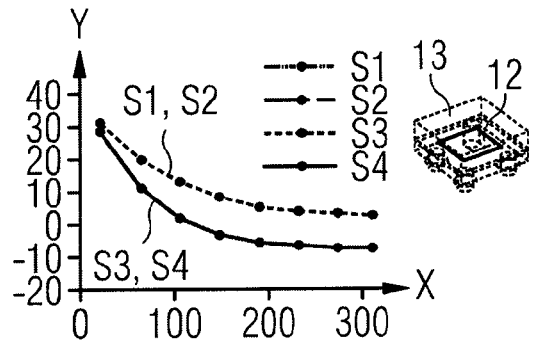

In FIG. 5B, the stress tensor is plotted versus the thickness of the cap body 13 for two further embodiments of the semiconductor device 10. In these two embodiments, the environmental sensor 12 is square shaped and it is positioned in the center of the semiconductor device 10. Therefore, the distribution of the bonding material 24 around the environmental sensor 12 is symmetrical and the stress tensor in x- and y-direction is similar. Curve S1 shows the stress tensor in y-direction and curve S2 in x-direction for a semiconductor device 10 with an integrated circuit 16 with a thickness of 150 μm. Similarly, curve S3 shows the stress tensor in y-direction and curve S4 in x-direction for a semiconductor device 10 with an integrated circuit 16 with a thickness of 100 μm.

The inset in FIG. 5B shows a three-dimensional view of the semiconductor device 10 with a square shaped environmental sensor 12.

Figure 6A:
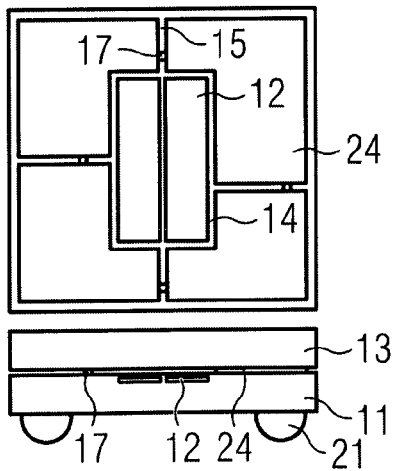
FIGS. 6A and 6B show a top view and a cutaway view of exemplary embodiments of the semiconductor device.

In FIG. 6A, a top view and a cutaway view of an exemplary embodiment of the semiconductor device 10 are shown. In the top view, the cap body 13 is not shown. Two environmental sensors 12, which are rectangular shaped, are arranged in the center of the semiconductor device 10. The bonding material 24 is arranged around the environmental sensors 12 and four channels 15 extend through the bonding material 24. Additionally, in each of the channels 15, a wall 17 is arranged. The thickness of the wall 17 amounts to less than 10 μm, such that the wall 17 is still permeable for gases. Optionally, the bonding material 24 comprises a polymer such that the pore size of the polymer is large enough that the walls 17 are permeable for gases. With this, liquids or solids cannot pass through the channel 15 towards the volume of gas 14 but gases can diffuse through the walls 17. In the cutaway view of the exemplary embodiment of the semiconductor device 10, the bonding material 24 and the channel 15 with the wall 17 are shown.

Figure 6B:
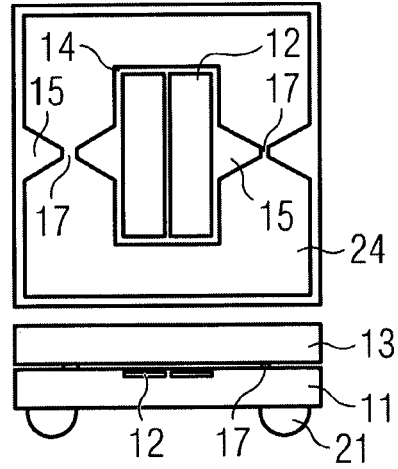

In FIG. 6B, a top view and a cutaway view of another exemplary embodiment of the semiconductor device 10 are shown. The setup of the embodiment of the semiconductor device 10 is the same as shown in FIG. 6A, except for the shape of the channels 15. In this embodiment, only two channels 15 are arranged within the bonding material 24 and the diameter of the channels 15 is larger than in the case of FIG. 6A. Within each of the channels 15, a wall 17 is arranged. The diameter of the channels 15 decreases from the outside of the semiconductor device 10 towards the wall 17 and it increases from the wall 17 towards the volume of gas 14. The thickness of the wall 17 on the right side is smaller than the thickness of the wall 17 on the left side. In the cutaway view, the different thicknesses of the two walls 17 are shown.

Figure 7:
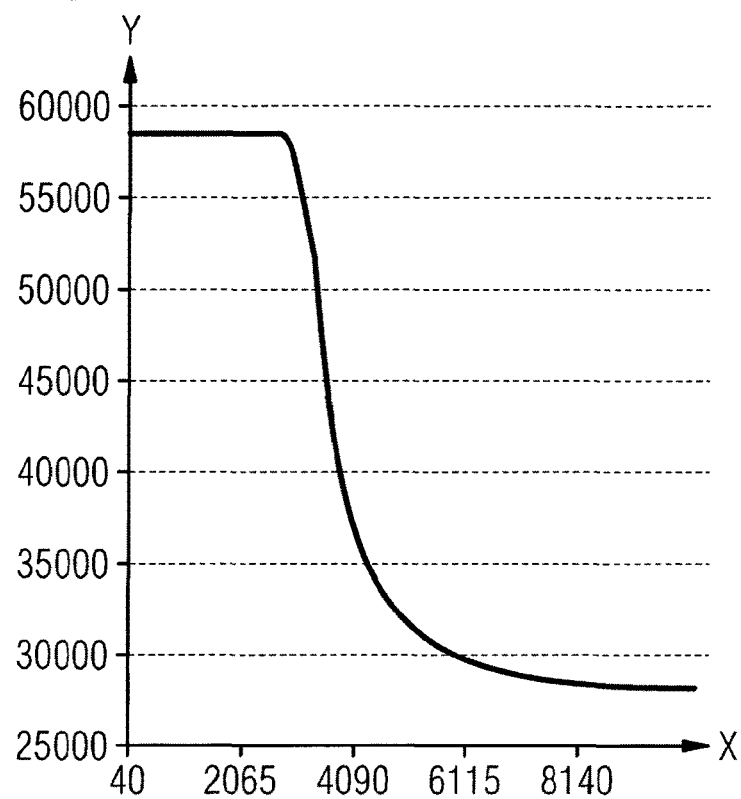
In FIG. 7, the capacitance is plotted versus time for an exemplary embodiment of the semiconductor device.

In FIG. 7, the capacitance versus time is plotted for an exemplary embodiment of the semiconductor device 10. The capacitance plotted on the y-axis is measured versus time, plotted on the x-axis, by a capacitive pressure sensor 23. The capacitance is given in picofarad/10000 and the time is given in seconds. In this embodiment, the thickness of the wall 17 within the channel 15 amounts to 250 μm. In the environment of the semiconductor device 10, the pressure is decreased from 990 mbar to 215 mbar. Because of the porosity of the wall 17, the capacitance indicating the pressure measured by the capacitive pressure sensor 23 decreases with time. After two hours, the pressure is equilibrated between the environment of the semiconductor device 10 and the volume of gas 14 around the capacitive pressure sensor 23. Therefore, gases can still diffuse through the wall 17.

Figure 8A:
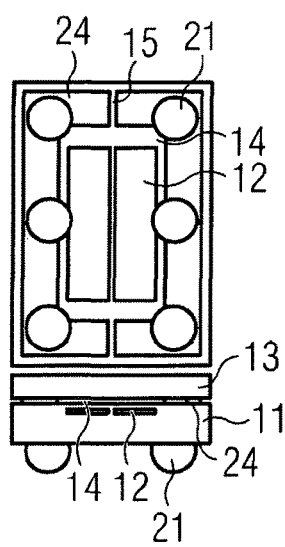
FIGS. 8A to 8C show top views and cutaway views of exemplary embodiments of the semiconductor device.

In FIG. 8A, a top view and a cutaway view of an exemplary embodiment of the semiconductor device 10 are shown. In the top view, the substrate body 11 and the cap body 13 are not shown. Two environmental sensors 12, which are rectangular shaped, are arranged in the center of the semiconductor device 10. The bonding material 24 is symmetrically arranged around the environmental sensors 12 and the volume of gas 14. In order to clarify the position of the solder balls 21, they are also shown in the top view. Six solder balls 21 are symmetrically distributed on the bottom side 26 of the substrate body 11. In this embodiment, the solder balls 21 are arranged below the bonding material 24 but not below the environmental sensors 12. In the cutaway view, it is shown where the solder balls 21 are positioned.

Figure 8B:
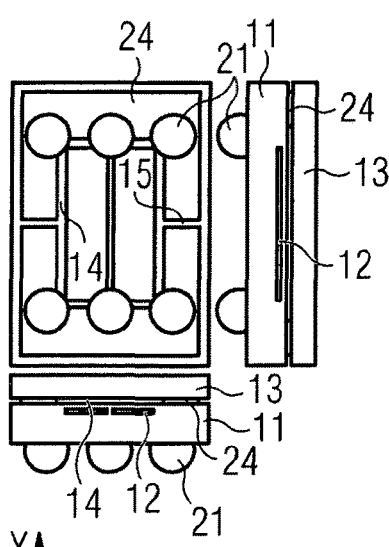

In FIG. 8B, a top view and two cutaway views of an exemplary embodiment of the semiconductor device 10 are shown. The setup of this embodiment is similar to the setup of the semiconductor device 10 shown in FIG. 8A, except for the position of the solder balls 21 and the position of the channels 15. In this embodiment, the semiconductor device 10 comprises only two channels 15 within the bonding material 24. In this embodiment, the solder balls 21 are arranged below the bonding material 24 and below the edge of the environmental sensors 12. In this case, the semiconductor device 10 is very stiff in x-direction.

Figure 8C:
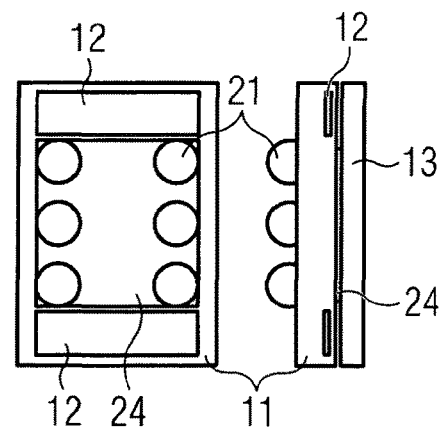
Figure 7:
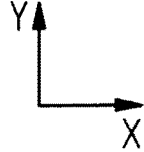

In FIG. 8C, a top view and a cutaway view of an exemplary embodiment of the semiconductor device 10 are shown. In the top view, it is shown that the semiconductor device 10 comprises two rectangular shaped environmental sensors 12 which are arranged at opposite sides of the semiconductor device 10 in lateral direction. The bonding material 24 is arranged in the center of the semiconductor device 10 between the two environmental sensors 12 in lateral direction. In the top view, also the position of the solder balls 21 is indicated, which is below the bonding material 24. In this embodiment, the environmental sensors 12 are in direct contact with the gas of the environment of the semiconductor device 10 because of the shape of the bonding material 24. The stress on the environmental sensors 12 is minimized because of the position of the solder balls 21.

With FIGS. 9A to 9K, an exemplary embodiment of the method for forming a semiconductor device 10 is described.

Figure 9A:
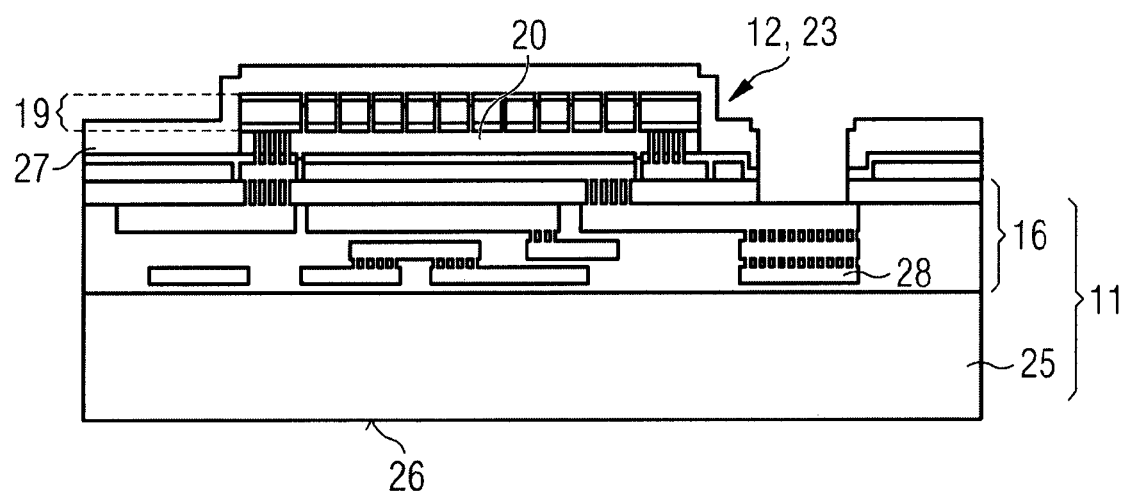

FIG. 9A shows the substrate body 11 which comprises an integrated circuit 16 which can be for example a complementary metal oxide semiconductor device. The integrated circuit 16 is arranged on top of a substrate 25 which is comprised by the substrate body 11 and which can comprise silicon or glass. On top of the integrated circuit 16 the environmental sensor 12 is arranged. In this embodiment the environmental sensor 12 is a capacitive pressure sensor 23. By arranging the capacitive pressure sensor 23 on top of the integrated circuit 16 instead of next to it, the footprint of the semiconductor device 10 is reduced. In this exemplary embodiment the capacitive pressure sensor 23 comprises a cavity 20 below a membrane 19. The capacitive pressure sensor 23 is electrically connected to the integrated circuit 16. The integrated circuit 16 comprises a back contact 28. In order to close the cavity 20 a sealing layer 27 is deposited on top of the membrane 19 and around the membrane 19. The sealing layer 27 can comprise silicon nitride.

Figure 9B:
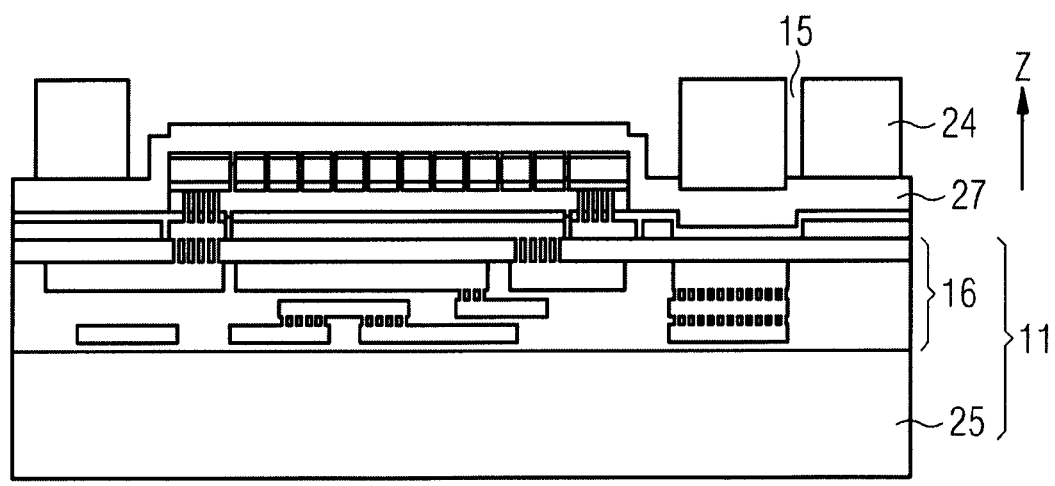

In FIG. 9B, it is shown that the bonding material 24 is applied to the sealing layer 27. The bonding material 24 can comprise a photo-sensitive glue layer which can be polymer based or polyimide based. By applying a mask, the bonding material 24 is patterned in such a way that it is removed from the area above the membrane 19 and around the membrane 19. Additionally, one channel 15 extending through the bonding material 24 in lateral direction is formed in the bonding material 24. The thickness of the bonding material 24 in z-direction can be between 1 and 25 µm.

Figure 9C:
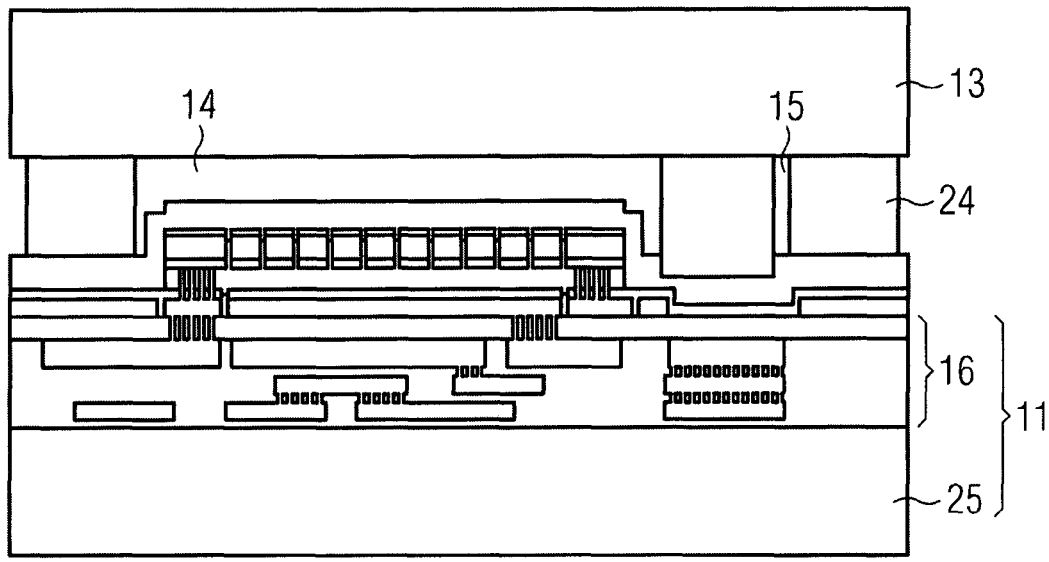

As shown in FIG. 9C in a next step of the method for forming a semiconductor device 10, the cap body 13 is attached to the bonding material 24. The cap body 13 is connected with the bonding material 24 at elevated temperatures. The cap body 13 can comprise silicon, glass, or glass with a coefficient of thermal expansion which is similar to the coefficient of thermal expansion of the substrate body 11. After attaching the cap body 13 to the bonding material 24, the semiconductor device 10 is airtight except for the channel 15.

Figure 9D:
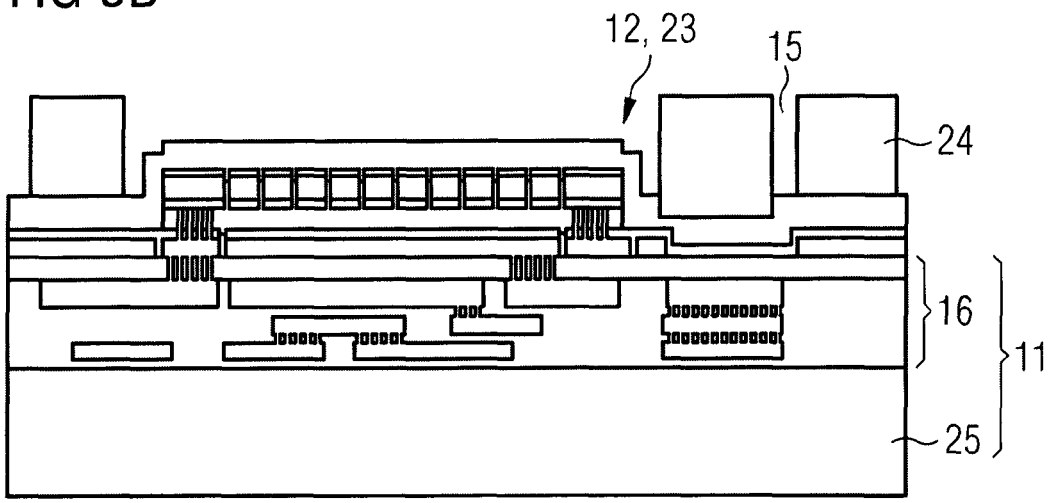

As shown in FIG. 9D, in another embodiment of the method for forming a semiconductor device 10, a metal layer is deposited as the bonding material 24. In this embodiment, the bonding material 24 can comprise aluminum or aluminum-germanium. The thickness of the bonding material 24 amounts to approximately 10 µm. By applying a mask, the bonding material 24 is patterned in such a way that the bonding material 24 is removed from the area above the membrane 19 and around the membrane 19. Furthermore, the channel 15 is formed within the bonding material 24.

Figure 9E:
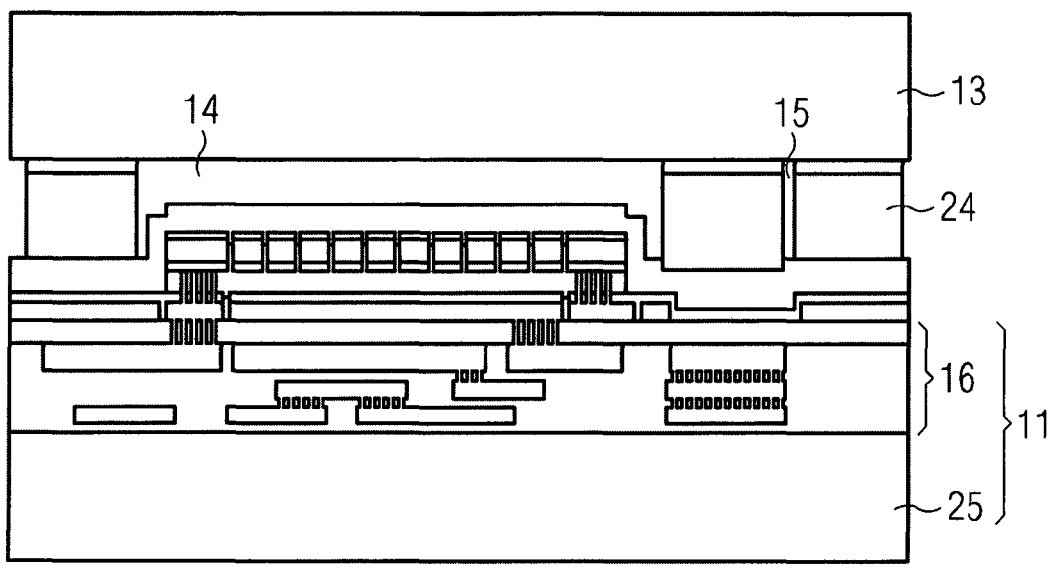

In a next step of the method for forming a semiconductor device 10, as shown in FIG. 9E, the cap body 13 is connected with the bonding material 24. In this case, the cap body 13 and the bonding material 24 are connected via eutectic bonding. The cap body 13 is grinded to the required thickness before the attachment to the bonding material 24. The cap body 13 and the bonding material 24 are connected at a bonding temperature of approximately 400° C. Therefore, a very stable and high-temperature compatible bond is formed. Because of the compatibility with high temperatures in this embodiment of the method, it is possible to form an electrically conductive via 18 in the substrate body 11 with tungsten instead of copper. Furthermore, because the bonding material 24 comprises a metal, the stiffness of the whole semiconductor device 10 is increased.

Figure 9F:
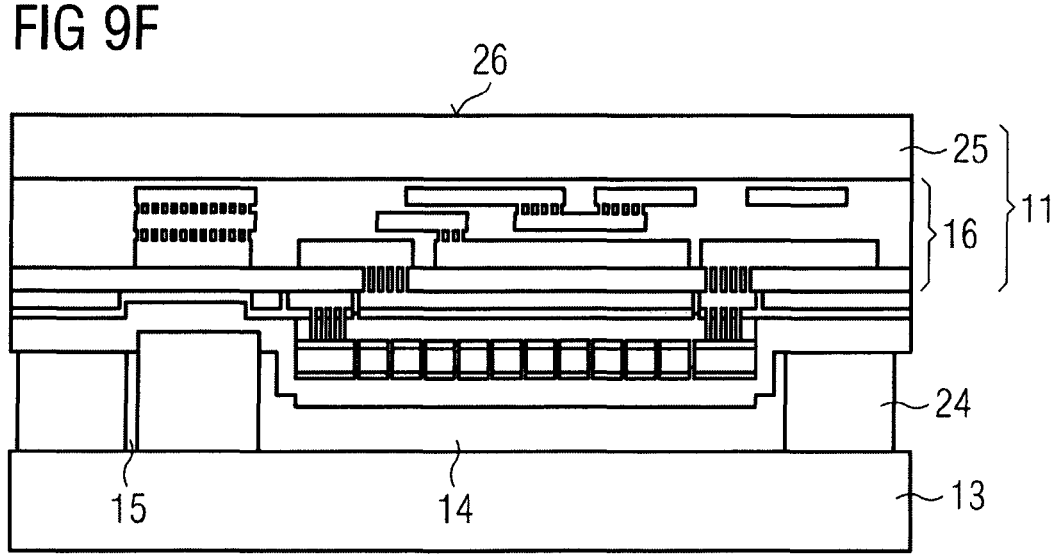

In FIG. 9F, it is shown that after attaching the cap body 13 to the bonding material 24, the substrate body 11 is thinned to a required thickness of 100 to 150 µm by grinding. This thickness is required for the formation of electrically conductive vias 18 in the substrate body 11.

Figure 9G:
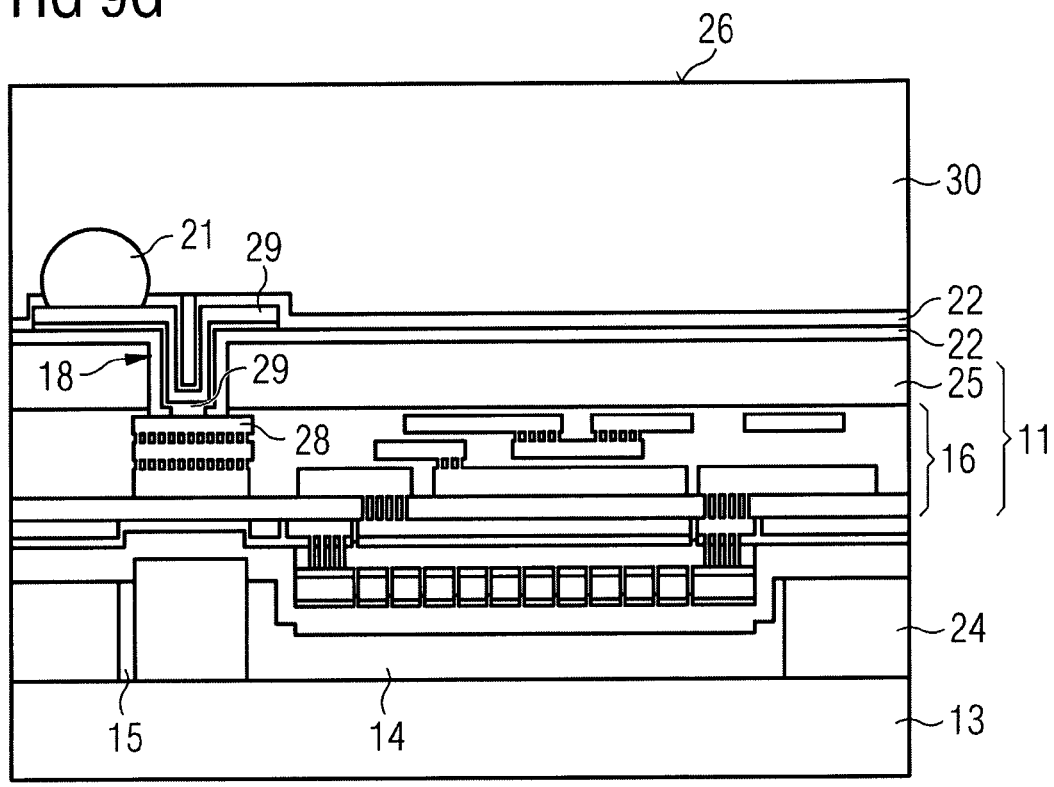

In FIG. 9G, it is shown that in the next step of the method, an electrically conductive via 18 is formed in the substrate body 11. At first, a trench is formed in the substrate 25, for example by deep reactive ion etching. The trench extends through the whole substrate 25 in vertical direction z from the bottom side 26 towards a back contact 28 of the integrated circuit 16. An electrically conductive material 29 is deposited within the trench and it electrically contacts the back contact 28 and it is electrically isolated against the substrate 25 by an isolation layer 22. The electrically conductive material 29 can comprise copper or tungsten. At the bottom side 26, the electrically conductive material 29 is contacted by a solder ball 21. The remaining part of the bottom side 26 is covered with another isolation layer 22. As a next step, a grinding tape 30 is applied at the bottom side 26.

Figure 9H:
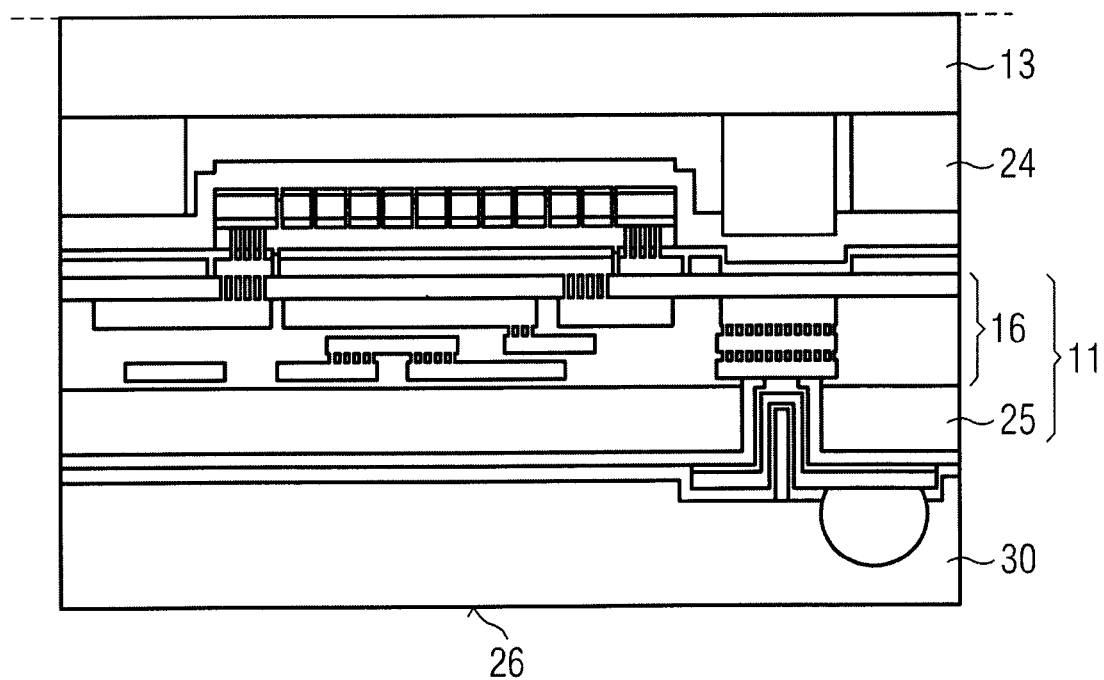

As shown in FIG. 9H, the cap body 13 is grinded to the required thickness of 100 to 150 µm. It is also possible that the cap body 13 is grinded to the required thickness before attaching the cap body 13 to the bonding material 24. The required thickness of the cap body 13 depends on the thickness and the material of the substrate body 11. In an optional embodiment, the thicknesses of the substrate body 11 and the cap body 13 are approximately equal such that the capacitive pressure sensor 23 is positioned in the plane of minimal stress.

Figure 9I:
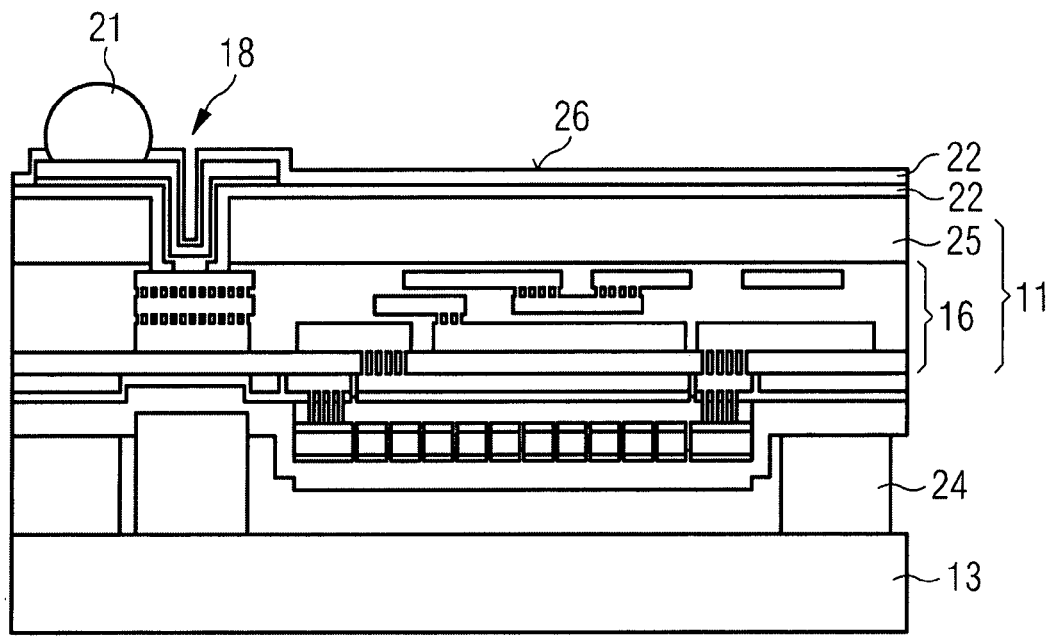

In a next step, as shown in FIG. 9I, the grinding tape 30 is removed from the bottom side 26 such that the solder ball 21 can be electrically contacted.

Figure 9J:
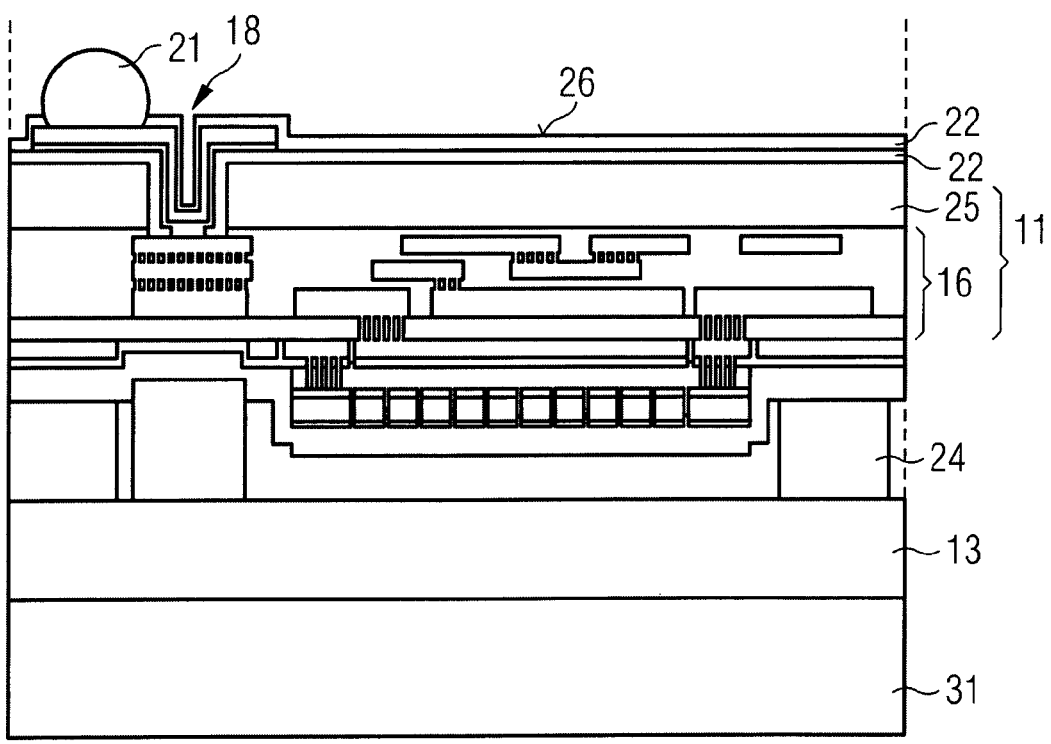

In FIG. 9J, it is shown that a dicing foil 31 is applied to the cap body 13 such that the semiconductor device 10 can be singulated via dicing. After the dicing step, the semiconductor device 10 is cleaned.

Figure 9K:
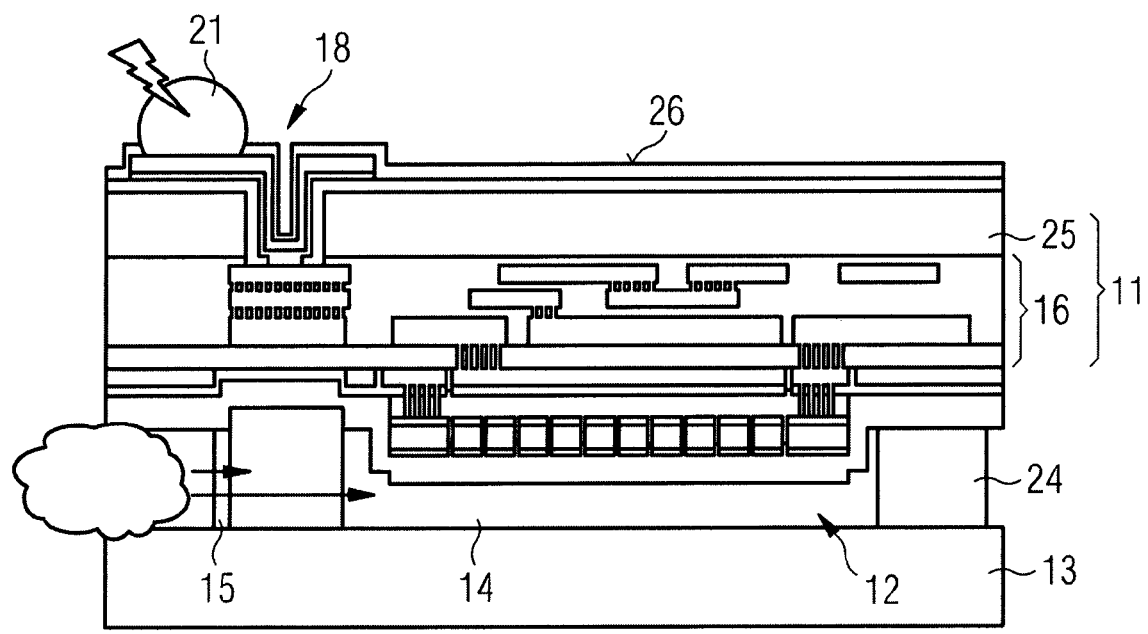

In FIG. 9K, it is shown that the dicing foil 31 is removed after dicing. The solder ball 21 is electrically contacted and the semiconductor device 10 can be tested and calibrated. Therefore, the semiconductor device 10 can be vacuum-picked at the cap body 13. For the testing and calibration of the capacitive pressure sensor 23, gas pressure is applied to the semiconductor device 10 from the side of the channel 15.

We claim:

1. A semiconductor device comprising:
   a substrate body;
   an environmental sensor;
   a cap body; and
   a volume of gas, wherein the environmental sensor and the volume of gas are arranged between the substrate body and the cap body in a vertical direction which is perpendicular to a main plane of extension of the substrate body, wherein at least one channel between the substrate body and the cap body connects the volume of gas with an environment of the semiconductor device such that the channel is permeable for gases, wherein the substrate body and the cap body are connected via a bonding material, wherein the channel extends in a lateral direction through the bonding material, wherein a thickness of the substrate body amounts to at least 80% of a thickness of the cap body and at most 120% of the thickness of the cap body, and wherein the bonding material comprises a porous polymer so that the bonding material is permeable for the gases in the lateral direction.

2. The semiconductor device according to claim 1, wherein the environmental sensor comprises at least one of the following:
- a capacitive pressure sensor with a membrane,
- a temperature sensor,
- an optical sensor,
- an absolute pressure sensor,
- a Hall sensor,
- a gas sensor,
- a humidity sensor,
- a gas flow sensor, or
- a differential pressure sensor.

3. The semiconductor device according to claim 1, wherein the environmental sensor is arranged on an integrated circuit.

4. The semiconductor device according to claim 1, wherein the semiconductor device is air-tight except for the channel.

5. The semiconductor device according to claim 1, wherein the volume of gas is arranged above the environmental sensor, the channel is arranged next to the environmental sensor and the channel extends in the lateral direction which is perpendicular to the vertical direction.

6. The semiconductor device according to claim 1, wherein a wall is arranged across a width of the channel, and wherein a thickness of the wall amounts to less than 10 μm in the lateral direction.

7. The semiconductor device according to claim 1, wherein the thickness of the substrate body equals approximately the thickness of the cap body.

8. The semiconductor device according to claim 1, wherein coefficients of thermal expansion of the cap body and the substrate body are approximately the same.

9. The semiconductor device according to claim 1, wherein the channel comprises at least one bend.

10. The semiconductor device according to claim 1, wherein the semiconductor device comprises at least one further channel, and wherein all channels are arranged symmetrically around the environmental sensor.

11. The semiconductor device according to claim 1, wherein the cap body comprises a first part which is transparent for electromagnetic radiation or a second part which is opaque.

12. The semiconductor device according to claim 1, wherein the cap body comprises at least one electrically conductive via.

13. The semiconductor device according to claim 1, wherein the substrate body comprises at least one vertical, electrically conductive via, or wherein the semiconductor device is surface mountable.

14. The semiconductor device according to claim 1, wherein the bonding material comprises at least one of the following:
- a polymer,
- a photo-definable glue,
- a non-photosensitive glue,
- a metal,
- an oxide, or
- a nitride.

15. A method for forming a semiconductor device, the method comprising:
- providing an environmental sensor on a substrate body;
- applying a bonding material on top of the substrate body;
- forming at least one channel in the bonding material which extends through the bonding material towards the environmental sensor; and
- connecting a cap body via the bonding material to the substrate body, wherein the at least one channel extends in a lateral direction through the bonding material, and wherein a thickness of the substrate body amounts to at least 80% of a thickness of the cap body and at most 120% of the thickness of the cap body, and wherein the bonding material comprises a porous polymer so that the bonding material is permeable for gases in the lateral direction.

16. The method according to claim 15, wherein a vertical, electrically conductive via is formed in the substrate body after the cap body is connected with the bonding material.

* * * * *